(12) United States Patent
Hatano et al.

(10) Patent No.: US 7,122,902 B2
(45) Date of Patent: Oct. 17, 2006

(54) SEMICONDUCTOR DEVICE

(75) Inventors: Keisuke Hatano, Tokyo (JP); Takahisa Abiru, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 258 days.

(21) Appl. No.: 10/127,266

(22) Filed: Apr. 22, 2002

(65) Prior Publication Data

US 2002/0163083 A1 Nov. 7, 2002

(30) Foreign Application Priority Data

Apr. 27, 2001 (JP) .............................. 2001-132696

(51) Int. Cl.
*H01L 23/48* (2006.01)

(52) U.S. Cl. ....................... 257/762; 257/758

(58) Field of Classification Search ................ 257/635, 257/637, 459, 758, 759, 760, 762, 763, 751; 438/418, 406, 455, 588, 612, 622, 623, 624, 438/683, 687

See application file for complete search history.

(56) References Cited

U.S. PATENT DOCUMENTS 3,781,596 A * 12/1973 Galli et al. ................ 257/762

| | | | |
|---|---|---|---|
| 6,020,640 A * | 2/2000 | Efland et al. ................ 257/751 |
| 6,084,304 A * | 7/2000 | Huang et al. ................ 257/762 |
| 6,117,769 A * | 9/2000 | Nogami et al. ............. 438/653 |
| 6,350,667 B1 * | 2/2002 | Chen et al. ................. 438/612 |
| 6,358,838 B1 * | 3/2002 | Furusawa et al. ........... 438/622 |
| 6,362,528 B1 * | 3/2002 | Anand ........................ 257/758 |
| 6,376,353 B1 * | 4/2002 | Zhou et al. ................. 438/612 |
| 6,451,681 B1 * | 9/2002 | Greer ......................... 438/601 |
| 6,468,906 B1 * | 10/2002 | Chan et al. ................. 257/622 |
| 6,509,258 B1 * | 1/2003 | Farrar ........................ 438/622 |
| 6,731,007 B1 * | 5/2004 | Saito et al. ................. 257/762 |
| 2001/0022403 A1 * | 9/2001 | Lee et al. ................... 257/781 |

FOREIGN PATENT DOCUMENTS

JP 11-135506 5/1999

* cited by examiner

*Primary Examiner*—Douglas W. Owens
(74) *Attorney, Agent, or Firm*—Katten Muchin Rosenman LLP

(57) ABSTRACT

A semiconductor device according to the present invention comprises a substrate; a copper interconnect layer formed on the top surface side of the substrate; an aluminum bonding pad formed on the top surface side of the copper interconnect layer with an aluminum-based material; and an aluminum interconnect formed on the top surface side of the copper interconnect layer with an aluminum-based material.

12 Claims, 15 Drawing Sheets

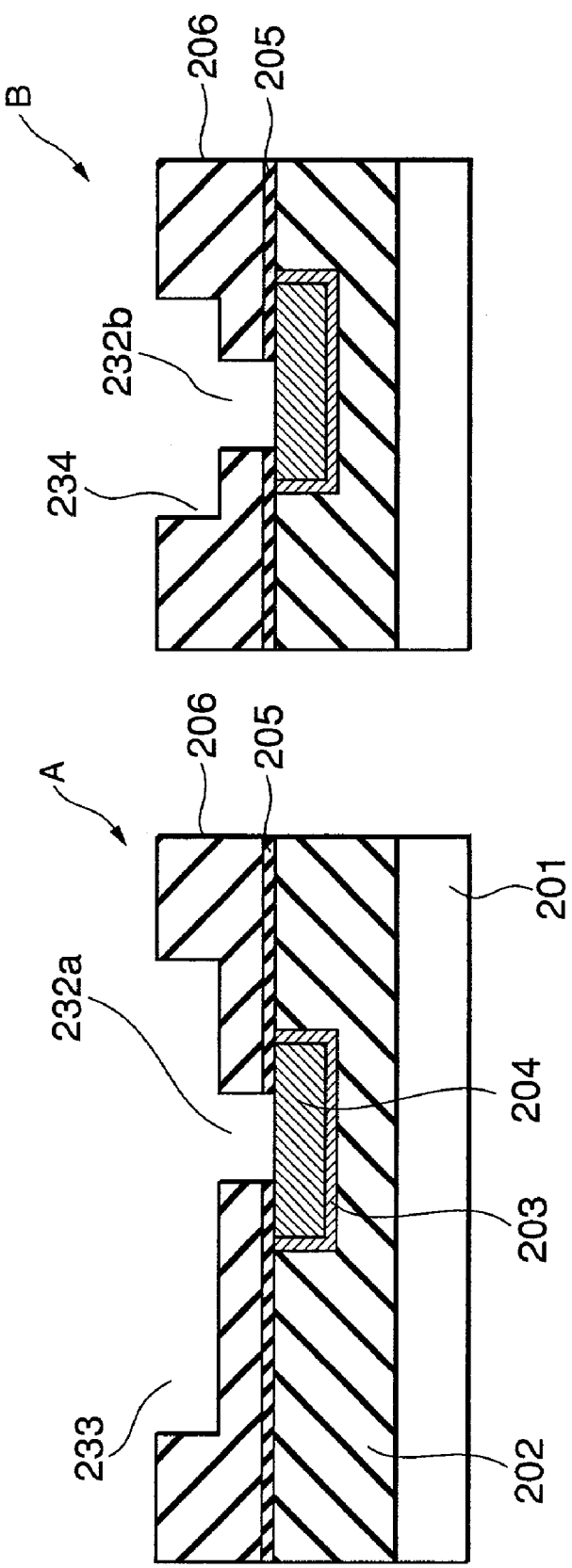

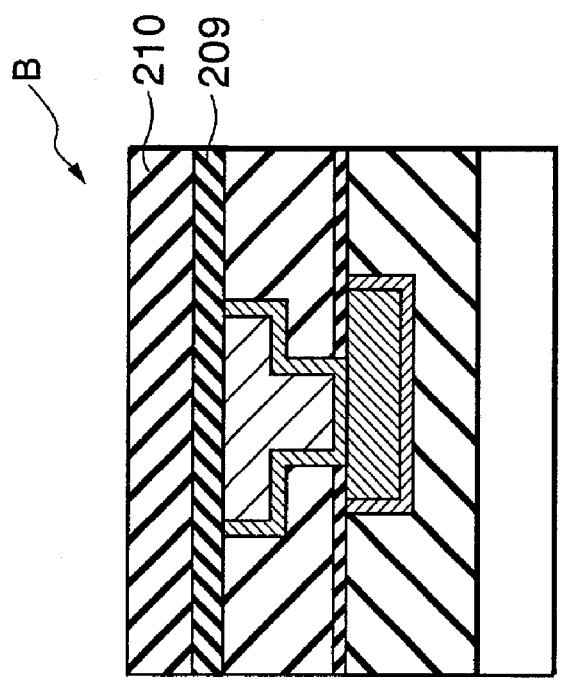
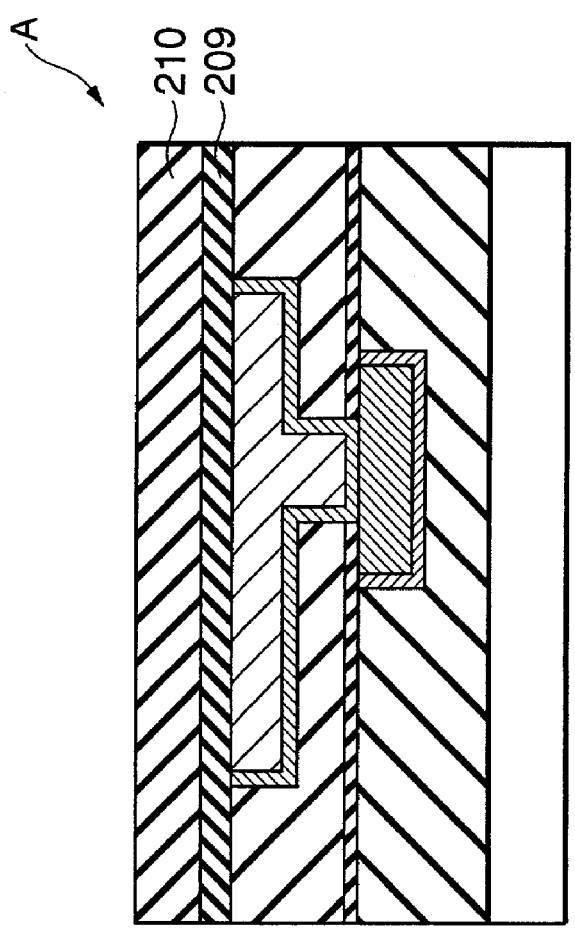
FIG.6A
FIG.6B

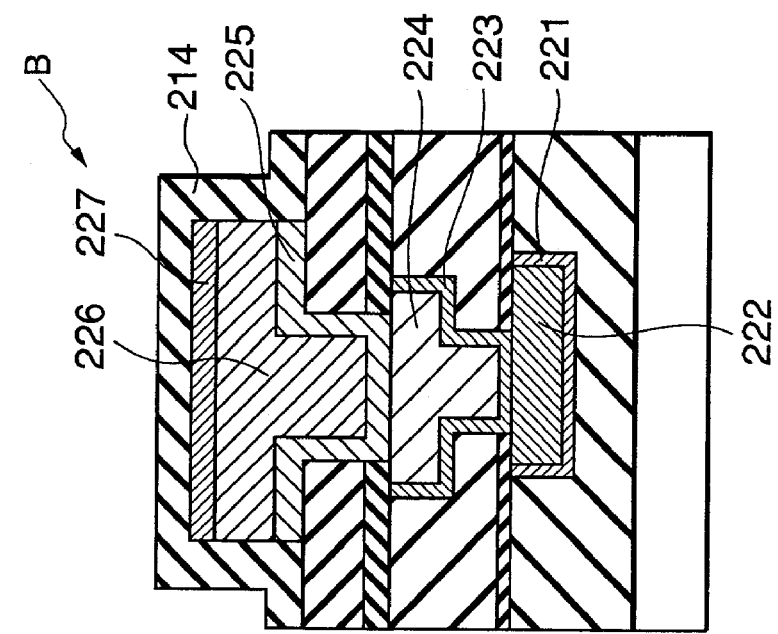
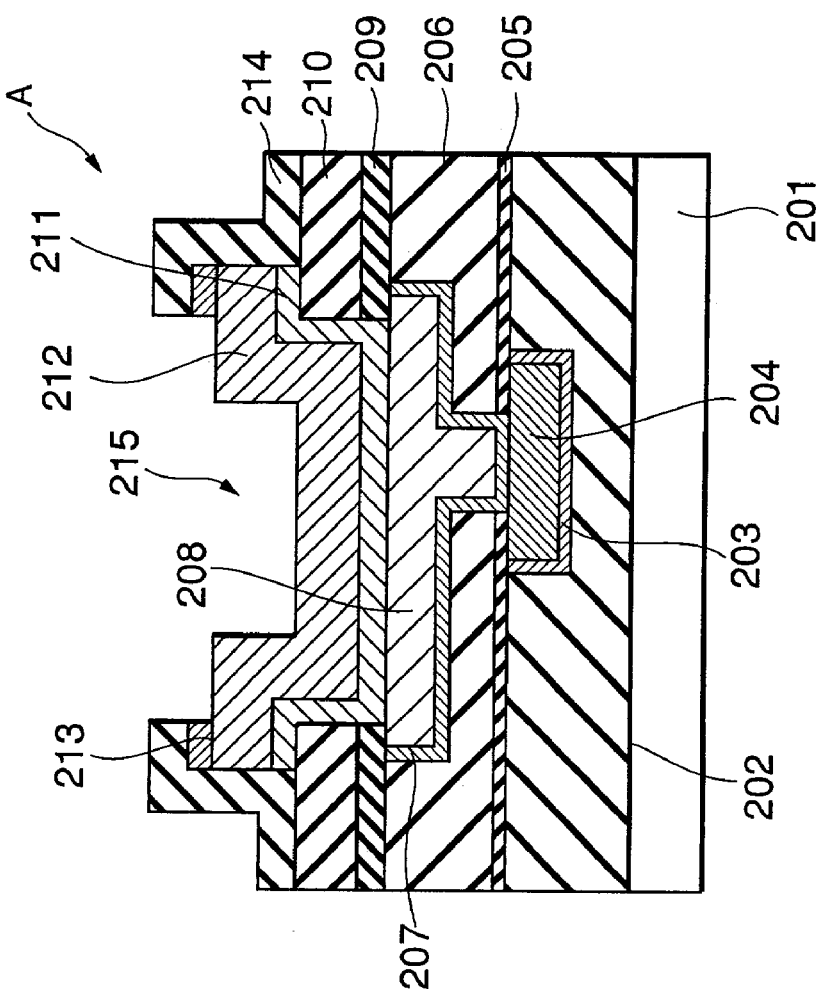
FIG. 10A
FIG. 10B

SEMICONDUCTOR DEVICE

BACKGROUND OF THE INVENTION

1. Field of the Invention

The present invention relates to a semiconductor device. In particular, it relates to a semiconductor device using copper interconnects, which has bonding pads made of aluminum.

2. Description of the Prior Art

In semiconductor integrated circuits beginning with the sub-quarter micron generation, demands have been made for alternative interconnect materials to replace the conventionally used aluminum-based interconnect. Accompanying the miniaturization of semiconductor integrated circuits, interconnect caused delay time has been increasing in comparison with the delay time due to the transistor elements. Moreover, accompanying the miniaturization of interconnect width, interconnect resistance has increased. The increase in interconnect resistance invites electric potential on the power supply line to fall and clock signal delay time to fluctuate, causing malfunctions to occur. In addition, since the density of the electric current flowing through an interconnect increases, adverse influences on reliability against electromigration have become more acute. It is difficult to deal with these problems using aluminum-based interconnects.

Copper has shown great promise as an interconnect material to be used for semiconductor integrated circuits from the sub-quarter micron generation forward. Copper is characterized by low resistance and is highly resistant against electromigration. These characteristics of copper are favorable for use in semiconductor integrated circuits from the sub-quarter micron generation forward.

When copper is used as the interconnect material, it can be generally considered that the bonding pads are also formed with copper.

However, since bonding pads formed with copper easily oxidize, problems caused by oxidation of the bonding pads may occur. Copper is a material that oxidizes very easily. In addition, when exposed to the outside atmosphere, oxidation is accelerated through the moisture in the air. The surface of the bonding pads formed with copper is easily oxidized. Once the surface of the bonding pads is oxidized, sufficient adhesive strength between the wiring and the bonding pad cannot be obtained where the wiring is bonded. Moreover, the copper oxidation does not stay at the surface layer, but progresses deep inside the copper. Oxidization of bonding pads formed with copper begins at the exposed portions not covered with a bonding ball, and the corrosion of the bonding pads then progresses. Ultimately, the entire bonding pad may be corroded. If the corrosion progresses deeper, the copper interconnect connected to a bonding pad may be corroded.

To deal with this problem, a semiconductor device comprising bonding pads formed with aluminum on top of the copper interconnect is disclosed in Japanese Patent Application Laid-Open No. Hei 11-135506. In this well known semiconductor device, as shown in FIG. 13, a copper interconnect 504 is formed on the upper surface side of a silicon substrate 501. The copper interconnect 504 is covered with an insulation/protection film 512. In the insulation/protection film 512, an aperture 512a, which reaches the copper interconnect 504, is provided. On top of the copper interconnect 504, an aluminum film 510 is formed. The aluminum film 510 is connected to the copper interconnect 504 through the aperture 512a. The aluminum film 510 is used as bonding pads.

FIGS. 14A through 14C illustrate a method for manufacturing such a well-known semiconductor device. Referencing FIG. 14A, a silicon oxide film 602, which acts as an interlayer film, is formed through a CVD method on top of a silicon substrate 601 whereupon transistors are formed. Typically, the film thickness of the silicon oxide film 602 is approximately 1 μm. Afterwards, a photolithography technique and a dry etching technique are used to form a trench 602a with a depth of 50 nm. The depth of the trench 602a is 550 nm. In addition, each of the apertures, which respectively reach the source, drain, and gate of a transistor formed on the silicon substrate 601, are formed. However, the formed apertures are not shown in FIG. 14A. Moreover, a titanium nitride film and copper film are sequentially formed through a CVD method. The titanium nitride film prevents diffusion of the copper film, and also improves the adhesiveness between the copper film and the silicon oxide film 602. The film thickness of the formed titanium nitride film and copper film are 50 nm and 500 nm, respectively. In addition, the portion of the formed titanium nitride film and copper film besides the portion that is within the trench 602a are removed through a chemical mechanical polishing (CMP) method. As shown in FIG. 14A, a titanium nitride layer 603 and copper interconnect 604 are formed.

Then, referencing FIG. 14B, a silicon nitride film 605, silicon oxide film 606, silicon nitride film 607, and silicon oxide film 608 are sequentially formed. The silicon nitride film 605 prevents the diffusion of copper from the copper interconnect 604. A trench 608a is formed, as shown in FIG. 14B, on the silicon nitride film 607 and silicon oxide film 608. A trench 606a, which reaches the copper interconnect 604, is formed within the trench 608a.

Then, referencing FIG. 14C, a titanium nitride film is formed through a CVD method. The thickness of the titanium nitride film is 50 nm. The formed titanium nitride film is etched back through an anisotropic etching. The titanium nitride film is not completely removed but remains at the sidewall of the trench 608a, thereby forming a titanium nitride layer 609. Similarly, the titanium nitride film is not completely removed but remains at the sidewall of the trench 606a, thereby forming a titanium nitride layer 610.

Between formation of the silicon nitride film and formation of the titanium nitride layers 609 and 610, the surface of the copper interconnect 604 is exposed, and a copper oxide is formed. In addition, on the surface of the copper interconnect 604, deposited material remains after etching back the titanium nitride film. Consequently, after forming the titanium nitride layer 610, the copper oxide and deposited material formed on the surface of the first layer copper interconnect 604 are removed by using $O_2$ plasma, diluted hydrofluoric acid, and hydrogen (hfac) gas.

Moreover, a copper film is formed through a CVD method. The portions other than the portions within the trenches 606a and 608a of the formed copper film are removed through a CMP method, to form a copper interconnect 611 as shown in FIG. 14C. Continuing, as shown in FIG. 15A, an insulation/protection film 612 is formed with silicon nitride. Moreover, an aperture 613 is formed using a lithographic technique and a dry etching technique.

Continuing, the copper oxide formed on the surface of the copper interconnect 611 is removed by using $O_2$ plasma, diluted hydrofluoric acid, and H (hfac) gas. Moreover, an aluminum film is formed using a sputtering method. The aluminum film is patterned through a lithographic technique and etching technique to form an aluminum bonding pad 614.

However, in the well-known semiconductor device manufacturing method, the aluminum film formed on the top surface side of the second layer copper interconnect 611 is used only for forming the bonding pad. More effective utilization of the formed aluminum film is desired.

BRIEF SUMMARY OF THE INVENTION

Objects of the Invention

The objective of the present invention is to provide a semiconductor device having a bonding pad formed on the copper interconnect with an aluminum-based material, wherein the process of forming the bonding pad is utilized more effectively.

Summary of the Invention

A semiconductor device according to the present invention comprises a substrate; a copper interconnect layer formed at the top surface side of the substrate; an aluminum bonding pad formed at the top surface side of the copper interconnect layer with an aluminum-based material; and an aluminum interconnect formed at the top surface side of the copper interconnect layer with an aluminum-based material.

BRIEF DESCRIPTION OF THE DRAWINGS

The above-mentioned and other objects, features and advantages of this invention will become more apparent by reference to the following detailed description of the invention taken in conjunction with the accompanying drawings, wherein;

FIGS. 4A and 4B are cross-sectional views respectively illustrating part of the manufacturing process of a semiconductor device according to the present invention;

FIGS. 6A and 6B are cross-sectional views respectively illustrating part of the manufacturing process of a semiconductor device according to the present invention;

FIGS. 10A and 10B are cross-sectional views respectively illustrating part of the manufacturing process of a semiconductor device according to the present invention;

DETAILED DESCRIPTION OF THE INVENTION

An embodiment of the semiconductor device according to the present invention, as shown in FIG. 1, comprises a silicon substrate 101. Elements such as transistors are formed on the silicon substrate 101, however, they are not shown in the figure. A silicon oxide film 102 is formed on the top surface of the silicon substrate 101.

Figures 1A, 1B:
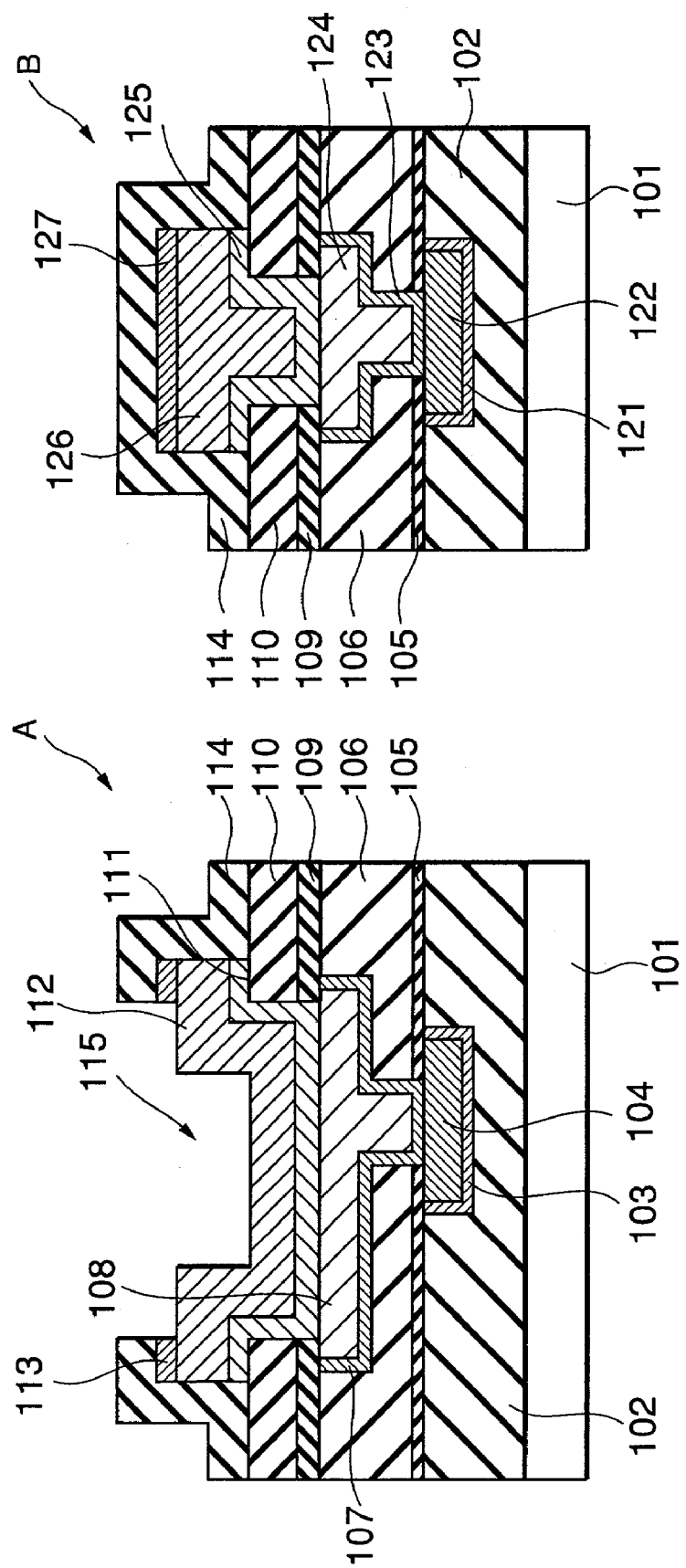
FIGS. 1A and 1B are cross-sectional views respectively illustrating an embodiment of a semiconductor device according to the present invention.

This semiconductor device has respectively different structures in the bonding pad formation area A where the bonding pad is formed and in the interconnect formation area B where the wiring is formed. In the bonding pad formation area A, as shown in FIG. 1A, a barrier metal film 103 and copper interconnect 104 are embedded into the silicon oxide film 102. Similarly, in the interconnect formation area B, as shown in FIG. 1B, a barrier metal film 121 and copper interconnect 122 are embedded into the silicon oxide film 102.

The silicon oxide film 102, barrier metal film 103, copper interconnect 104, barrier metal film 121, and copper interconnect 122 are covered with a copper diffusion preventive film 105. The copper diffusion preventive film 105 is formed by a film that prevents the copper diffusion, such as a silicon nitride. The copper diffusion preventive film 105 is covered with a silicon oxide film 106.

As shown in FIG. 1A, a contact which reaches the copper interconnect 104 is formed on a portion of the copper diffusion preventive film 105 and silicon oxide film 106 in the bonding pad formation area A. Moreover, a trench is formed on the silicon oxide film 106. A barrier metal film 107 and copper pad 108 are sequentially embedded into the trench and contact.

At the same time, as shown in FIG. 1B, a contact which reaches the copper interconnect 122 is formed on a portion of the copper diffusion preventive film 105 and silicon oxide film 106 in the interconnection forming area B. Moreover, a trench is formed in the silicon oxide film 106. A barrier metal film 123 and copper interconnect 124 are sequentially embedded into the trench and contact.

The silicon oxide film 106, barrier metal film 107, copper pad 108, barrier metal film 123, and copper interconnect 124 are covered with a silicon nitride film 109. The silicon nitride film 109 is covered with a silicon oxide film 110.

A contact via which reaches the copper pad 108 is formed on a portion of the silicon nitride film 109 and silicon oxide film 110 in the bonding pad formation area A as shown in FIG. 1A. A titanium nitride layer 111, aluminum pad 112, and titanium nitride layer 113 are sequentially formed on the top surface side of the copper pad 108. The aluminum pad 112 is formed with an aluminum-based material. In more detail, the aluminum pad 112 is formed with a material in which at least one element selected from a group consisting of copper and silicon is added to aluminum. The aluminum pad 112 has an area, which is substantially identical to that of the copper pad 108 when viewed from the top surface side of the silicon substrate 101. The titanium nitride layer 113 covers a part of the aluminum pad 112. The titanium nitride layer 111, aluminum pad 112, and titanium nitride layer 113 are electrically connected to the copper pad 108 through the contact via.

At the same time, another contact via which reaches the copper pad 124 is formed on a portion of the silicon nitride film 109 and silicon oxide film 110 in the interconnect formation area B as shown in FIG. 1B A titanium nitride layer 125, aluminum interconnect 126, and titanium nitride layer 127 (also referred to as a second barrier layer) are sequentially formed on the top surface side of the copper interconnect 124. The titanium nitride layer 125, aluminum interconnect 126, and titanium nitride layer 127 are electrically connected to the copper interconnect 124 through the contact via. The titanium nitride layer 125, aluminum interconnect 126, and titanium nitride layer 127 are formed by a process that is identical to the process for forming the titanium nitride layer 111, aluminum pad 112, and titanium nitride layer 113, at substantially the same time. The aluminum interconnect 126 is formed with the same material as that for the aluminum pad 112.

The silicon oxide film 110, titanium nitride layer 113, and titanium nitride layer 127 are covered with the insulator protection film 114. An aperture, which reaches the aluminum pad 112, is formed on the insulator protection film 114. A bonding wire not shown in the figure is connected to the aluminum pad 112 through the aperture.

FIGS. 2 through 10 illustrate an embodiment of a manufacturing method of a semiconductor device according to the present invention.

Figure 2A:
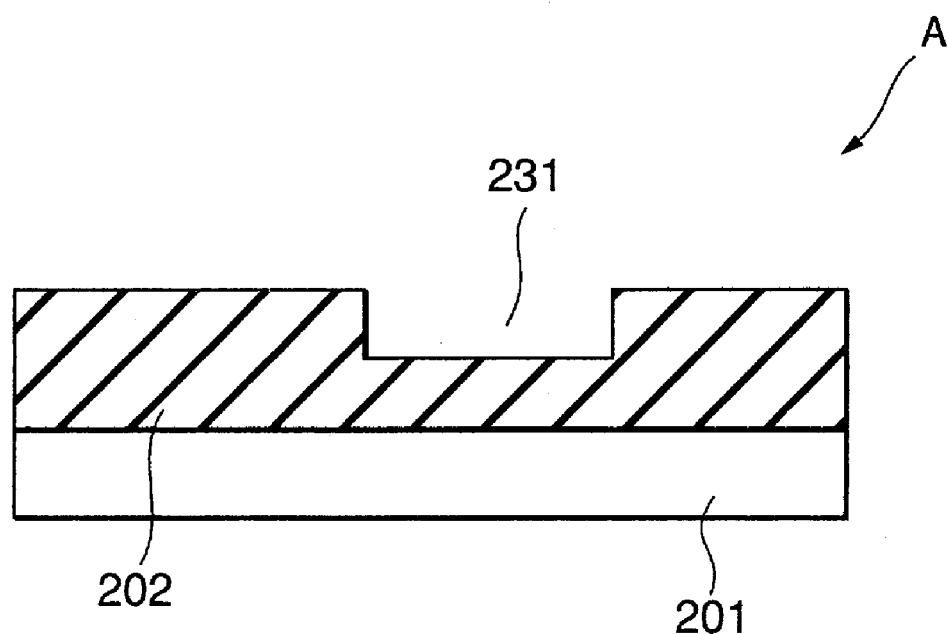
FIGS. 2A and 2B are cross-sectional views respectively illustrating part of the manufacturing process of a semiconductor device according to the present invention.
Figure 2B:
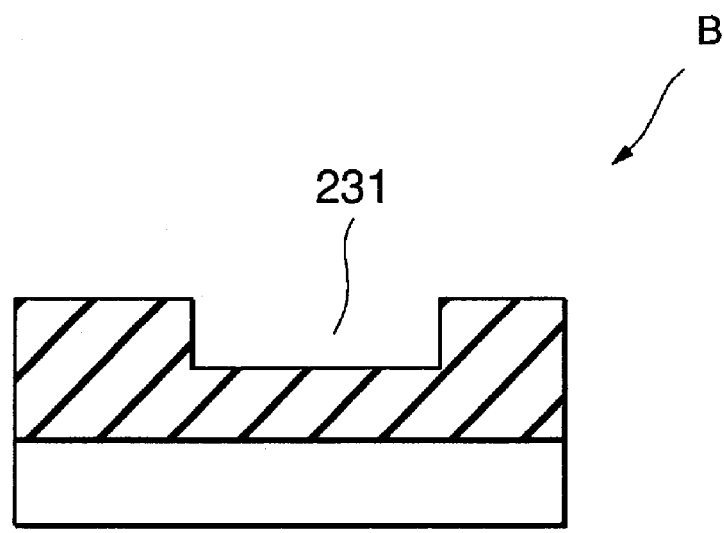

As shown in FIGS. 2A and 2B, a silicon oxide film 202 is formed on the top surface of a silicon substrate 201. A copper interconnect forming trench 231 is formed on the silicon oxide film 202 in both the bonding pad formation area A and interconnect formation area B.

Figure 3A:
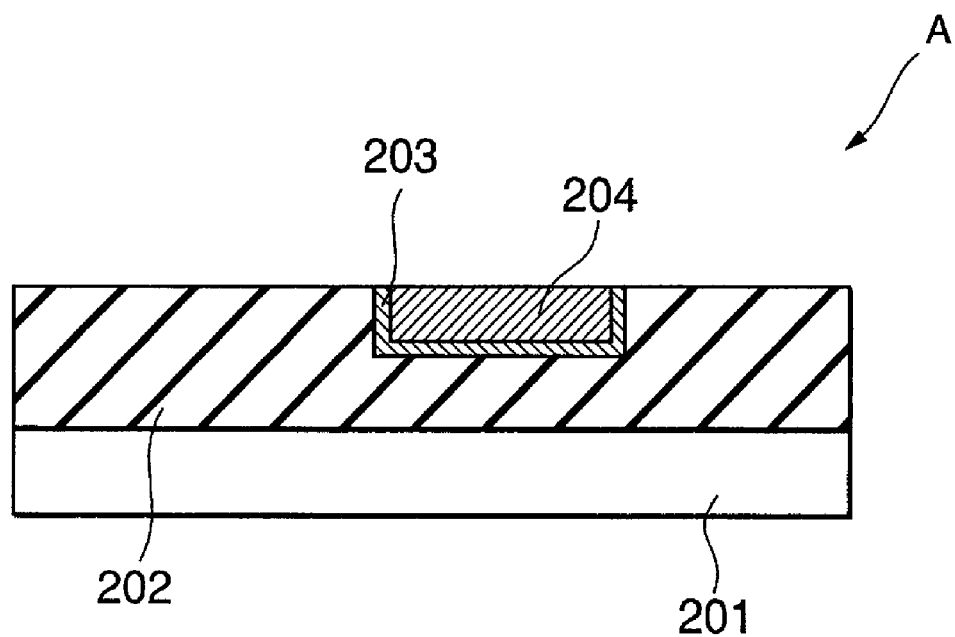
FIGS. 3A and 3B are cross-sectional views respectively illustrating part of the manufacturing process of a semiconductor device according to the present invention.
Figure 3B:
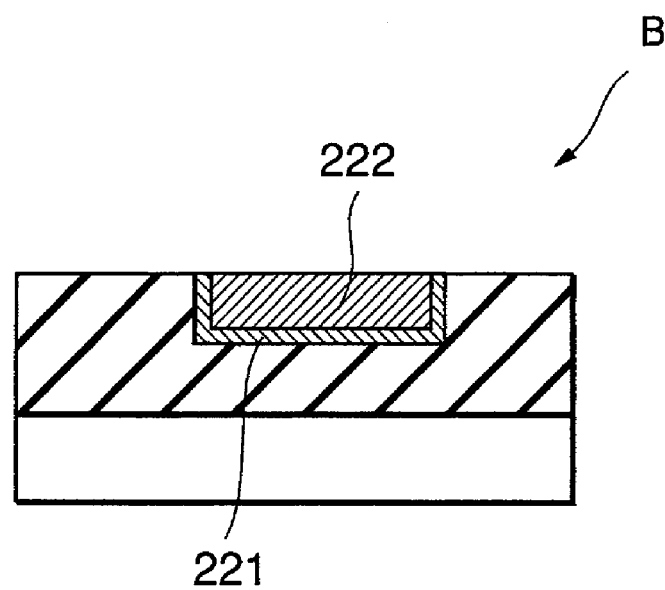

Continuing, a barrier metal film is formed on the entire surface of the top surface side of the silicon substrate 201. The barrier metal film is formed by a conductive film capable of preventing copper diffusion. A copper film is formed on that barrier metal film through an electroplating method. In addition, the portion of the formed barrier metal film and copper film other than the portion within the copper interconnect forming trench 231 is removed through a CMP method. As shown in FIG. 3A, the barrier metal film 203 and copper interconnect 204 are formed within the copper interconnect forming trench 231 in the bonding pad formation area A. Moreover, as shown in FIG. 3B, the barrier metal film 221 and copper interconnect 222 are formed within the copper interconnect forming trench 231 in the interconnect formation area B.

Continuing, as shown in FIGS. 4A and 4B, the copper diffusion preventive film 205 is formed on the silicon oxide film 202, barrier metal film 203, copper interconnect 204, barrier metal film 221, and copper interconnect 222. The copper diffusion preventive film 205 is formed with a material to prevent copper diffusion, such as a silicon nitride. Moreover, a silicon oxide film 206 is formed on the copper diffusion preventive film 205. Continuing, a copper pad forming trench 233 and a copper interconnect forming trench 234 are formed on the silicon oxide film 206, substantially at the same time. The copper pad forming trench 233 is formed within the bonding pad formation area A, whereas the copper interconnect forming trench 234 is formed within the interconnect formation area B. Moreover, a copper interconnect contact via 232a and a copper interconnect contact via 232b are formed from the respective bottom surfaces of the copper pad forming trench 233 and the copper interconnect forming trench 234, substantially at the same time. The copper interconnect contact via 232a reaches the copper interconnect 204 from the bottom surface of the copper pad forming trench 233. Similarly, the copper interconnect contact via 232b reaches the copper interconnect 222 from the bottom surface of the copper interconnect forming trench 234.

Figures 5A, 5B:
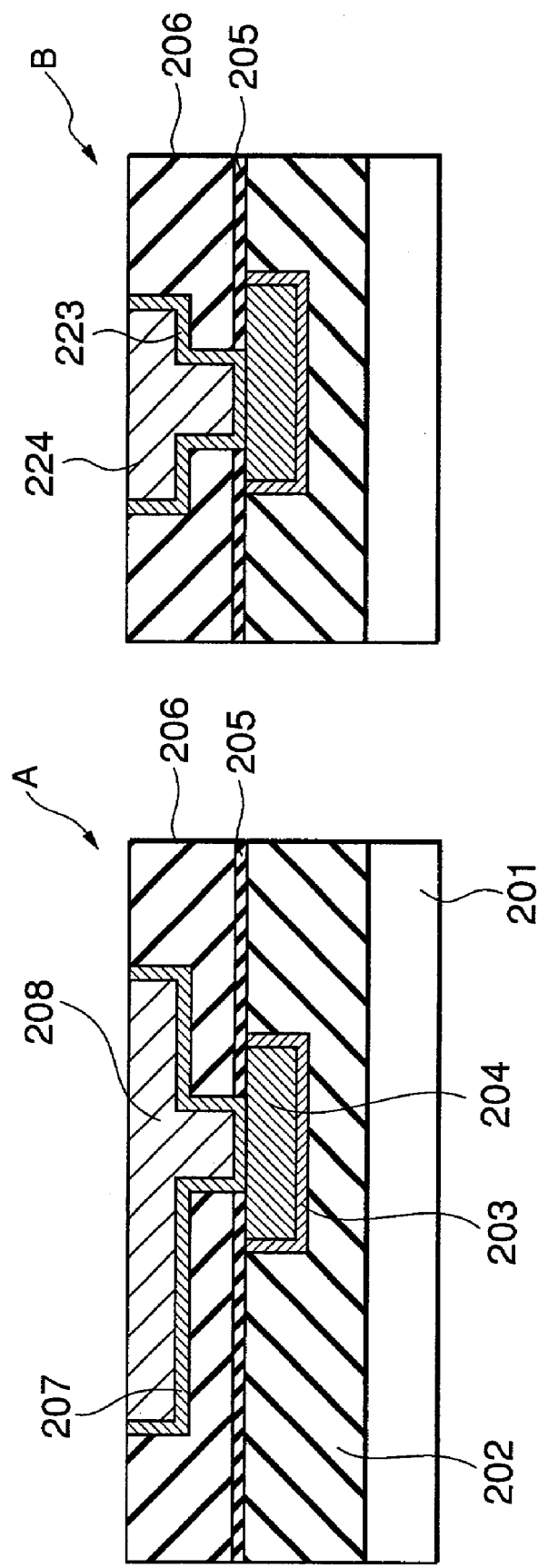
FIGS. 5A and 5B are cross-sectional views respectively illustrating part of the manufacturing process of a semiconductor device according to the present invention.

Continuing, a barrier metal film is formed at the entire surface at the top surface side of the silicon substrate 201. The barrier metal film is formed by a conductive film capable of preventing copper diffusion. A copper film is formed on the barrier metal film through an electroplating method. In addition, a portion other than the portions within the copper interconnect contact via 232a, copper interconnect contact via 232b, copper pad forming trench 233, and copper interconnect forming trench 234 of the formed barrier metal film and copper film is removed through a CMP method. As shown in FIG. 5A, a barrier metal film 207 and copper pad 208 are formed in the bonding pad formation area A so as to embed the copper interconnect contact via 232a and copper pad forming trench 233. As shown in FIG. 5B, a barrier metal film 223 and copper interconnect 224 are formed in the interconnect formation area B so as to embed the copper interconnect contact via 232b and copper interconnect forming trench 234.

Continuing, as shown in FIGS. 6A and 6B, a copper diffusion preventive film 209 and silicon oxide film 210 are sequentially formed on the entire surface of the top surface side of the silicon substrate 201. The copper diffusion preventive film 209 is formed by a material to prevent copper diffusion, such as a silicon nitride, silicon carbide, oxidized and nitrided silicon, carbonized and nitrided silicon, etc.

Figure 7B:
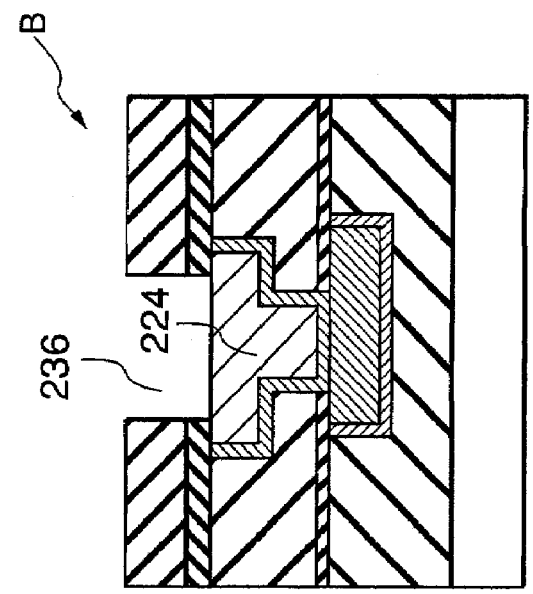
FIGS. 7A and 7B are cross-sectional views respectively illustrating part of the manufacturing process of a semiconductor device according to the present invention.
Figure 7A:
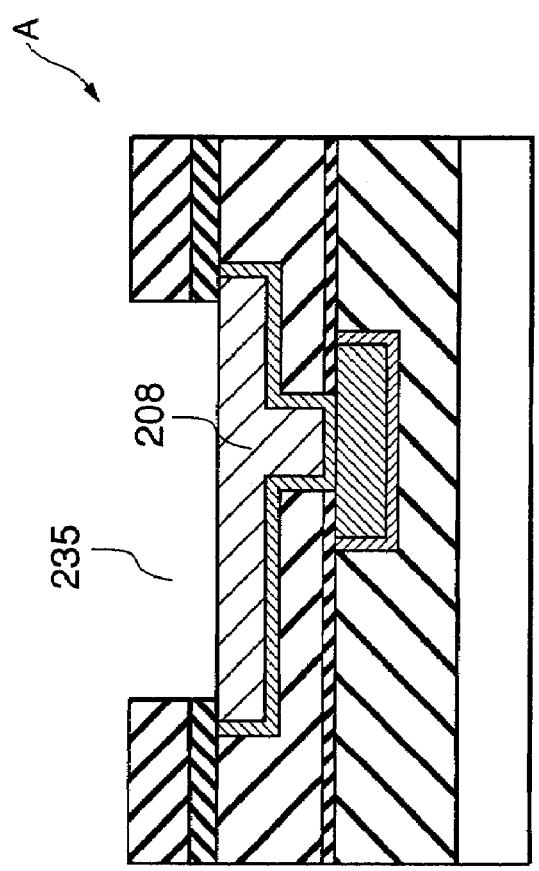

Continuing, as shown in FIGS. 7A and 7B, a pad contact via 235 and interconnect contact via 236 are formed, substantially at the same time. The pad contact via 235 is formed within the bonding pad formation area A, whereas the interconnect contact via 236 is formed within the interconnect formation area B. The pad contact via 235 reaches the top surface of the copper pad 208, penetrating through the copper diffusion preventive film 209 and silicon oxide film 210. The interconnect contact via 236 reaches the top surface of the copper interconnect 224 penetrating through the copper diffusion preventive film 209 and silicon oxide film 210.

Figure 8A:
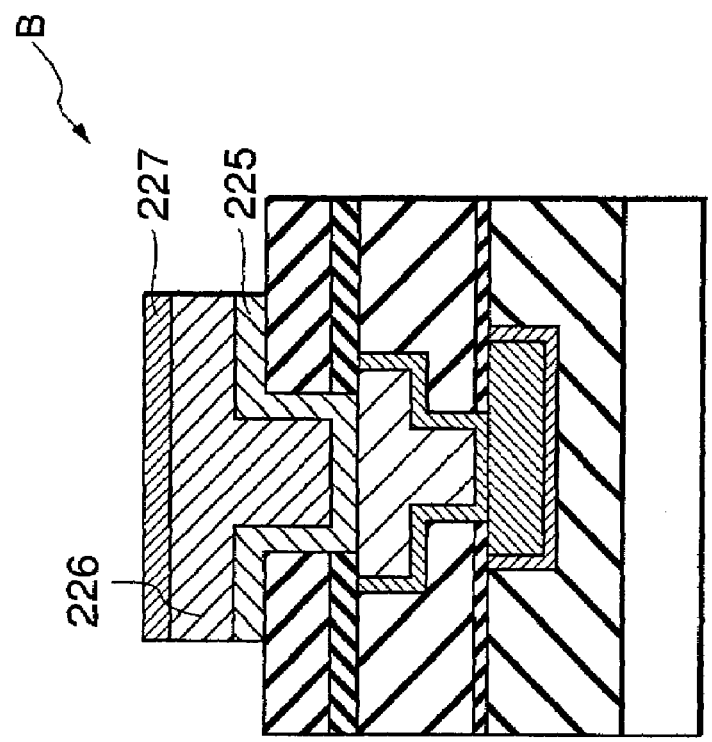
FIGS. 8A and 8B are cross-sectional views respectively illustrating part of the manufacturing process of a semiconductor device according to the present invention.
Figure 8B:
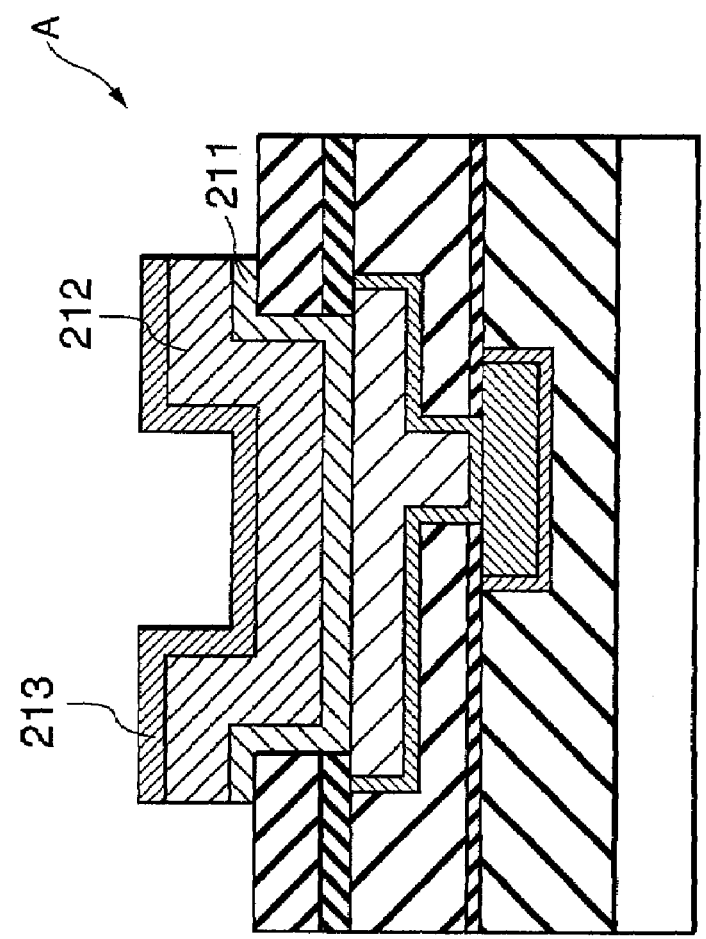

Continuing, a first titanium nitride film, aluminum-based film, and second titanium nitride film are sequentially formed on the entire surface of the top surface side of the silicon substrate 201. The first titanium nitride film is provided between the aluminum-based film, the copper pad 208, and the copper interconnect 224 to prevent the formed aluminum-based film from reacting with the copper pad 208 and copper interconnect 224. The aluminum-based film is formed by a material in which at least one element selected from a group consisting of copper and silicon is added to aluminum. The second titanium nitride film covers the aluminum-based film so as to function as an anti-reflection film. Moreover, etching is sequentially performed on the formed first titanium nitride film, the aluminum-based film, and the second titanium nitride film. As shown in FIG. 8A, a titanium nitride layer 211, aluminum pad 212, and titanium nitride layer 213 are formed on the bonding pad formation area A. At this time, as shown in FIG. 8B, a titanium nitride layer 225, aluminum interconnect 226, and titanium nitride layer 227 (also referred to as a second barrier layer) are formed on the interconnect formation area B simultaneously. The area of aluminum pad 212 is substantially identical to that of the copper pad 208 when viewed from the top surface side of the silicon substrate 201.

Figure 9B:
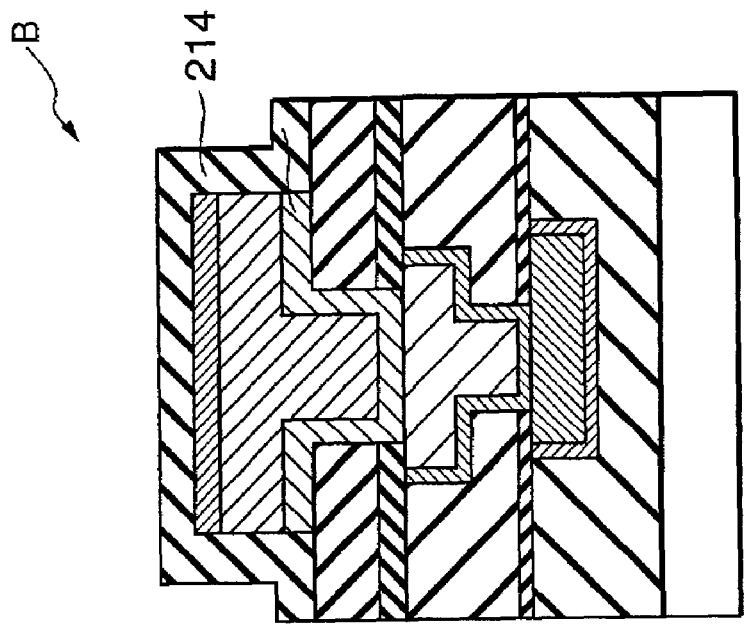
FIGS. 9A and 9B are cross-sectional views respectively illustrating part of the manufacturing process of a semiconductor device according to the present invention.
Figure 9A:
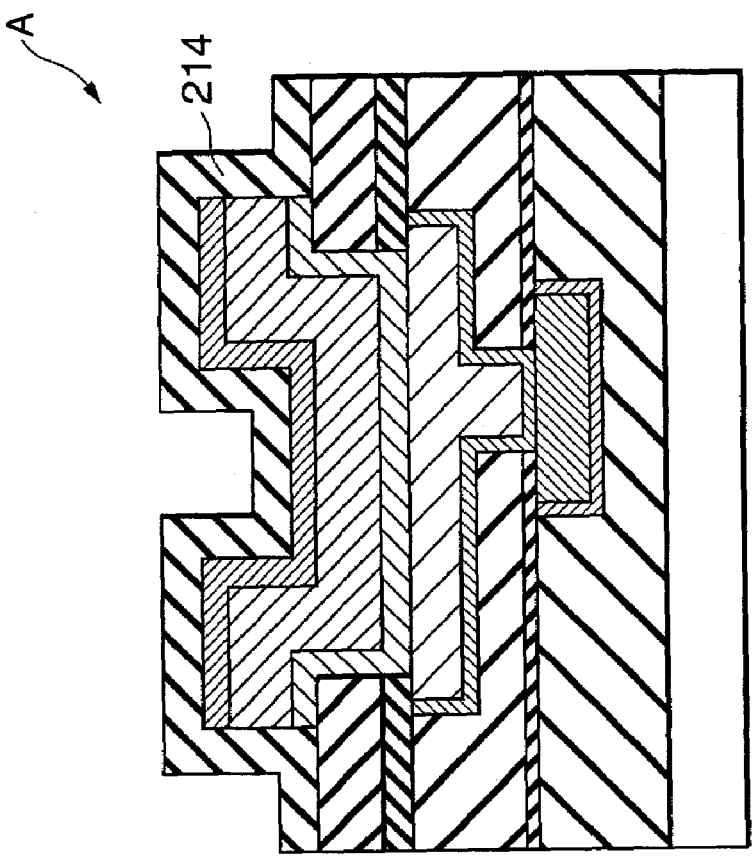

Continuing, as shown in FIGS. 9A and 9B, the insulator protection film 214 forms the entire surface of the top surface side of the silicon substrate 201.

Then, as shown in FIGS. 10A and 10B, a portion of the titanium nitride layer 213 and insulator protection film 214 on the aluminum pad 212 is removed to form an aperture 215. A bonding wire is connected to the aluminum pad 212 through the aperture 215.

With the semiconductor device manufacturing method of this embodiment, the aluminum pad 212 is formed on the top surface of the copper pad 208 at the same time as the aluminum interconnect 226 is formed on the top surface of the copper interconnect 224. The process for forming the aluminum pad is also utilized as a step to form one of the interconnect layers. Moreover, one interconnect layer is added to the semiconductor device, thereby improving the degrees of freedom during design.

Figure 11B:
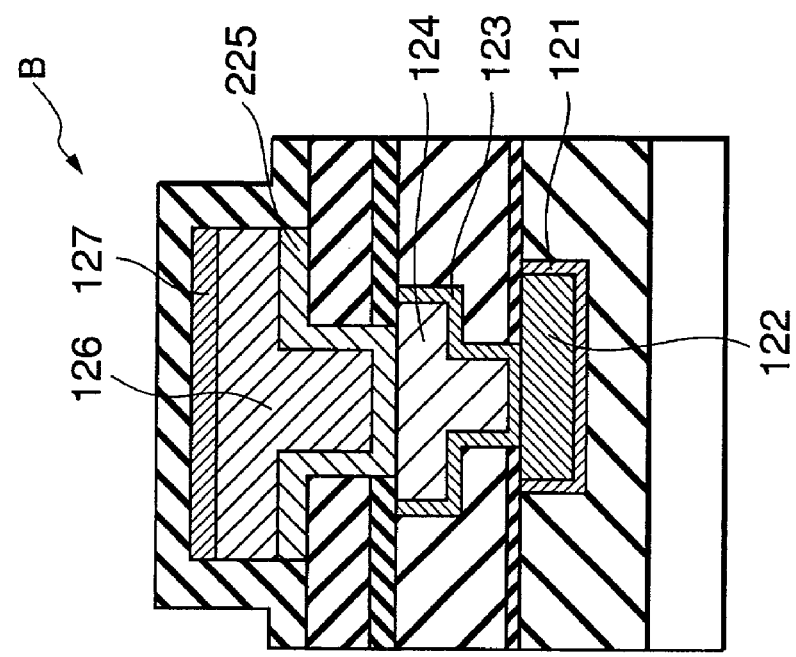
FIGS. 11A and 11B are cross-sectional views respectively illustrating other embodiments of the semiconductor device according to the present invention.
Figure 11A:
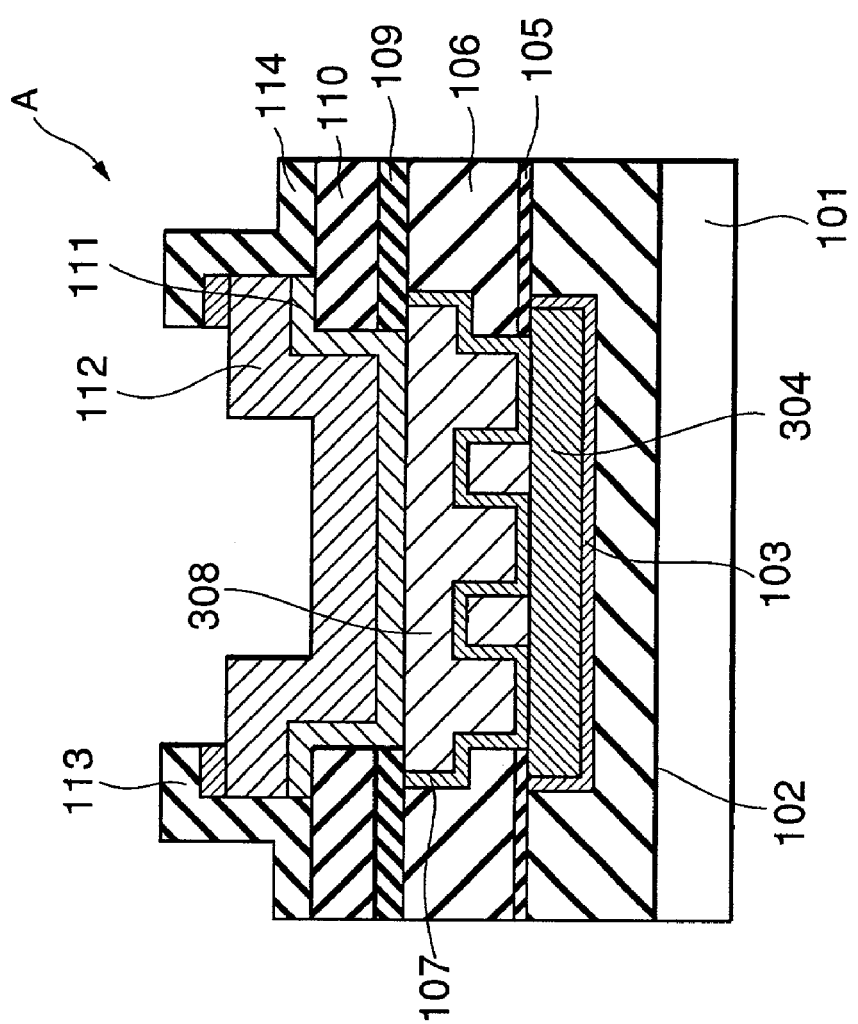

FIGS. 11A and 11B illustrate another embodiment of a semiconductor device according to the present invention. In this embodiment, a plurality of copper pads 304 and copper pads 308 are formed between the aluminum pad 112 and silicon substrate 101 instead of the copper interconnect 104 and copper pad 108. The copper pads 308 are mechanically and electrically connected to the aluminum pad 112 through a contact via formed between the silicon nitride film 109 and silicon oxide film 110. The copper pads 304 and copper pads 308 are mechanically and electrically connected through a contact via. The copper pads 304 and copper pads 308 have an area which is substantially identical to that of the aluminum pad 112. The area where the copper pads 304 come into contact with the copper pads 308 and the area where the copper pads 308 contact to the aluminum pad 112 can be enlarged. This allows the strength of the contact between the copper pads 304 and copper pads 308, and the strength of the contact between the copper pads 308 and aluminum pad 112 to be sufficiently strengthened. The aluminum pad 112, copper pads 304, and copper pads 308 having such a structure have high mechanical strength.

The semiconductor device manufacturing method shown in FIGS. 11A and 11B is same as the semiconductor device manufacturing method shown in FIGS. 2 through 10 other than the fact that the respective shapes of the copper interconnect forming trench 231 shown in FIG. 2A and the copper interconnect contact via 232a shown in FIG. 4A are changed.

FIGS. 11A and 11B illustrate the structure of a semiconductor device having a two-layer copper interconnect, wherein a two-layer copper pad is built up in the semiconductor device. In the case where there are n-layers of copper interconnects, up to n-layers of copper pads can be built up and connected. The more copper pads built up, the greater the mechanical strength of the semiconductor device becomes. In addition, to obtain the desired mechanical strength, m-layers ($m \leq n$) of copper pads can be mechanically connected sequentially as the copper pad layers become further away from the silicon substrate 101.

Figure 12C:
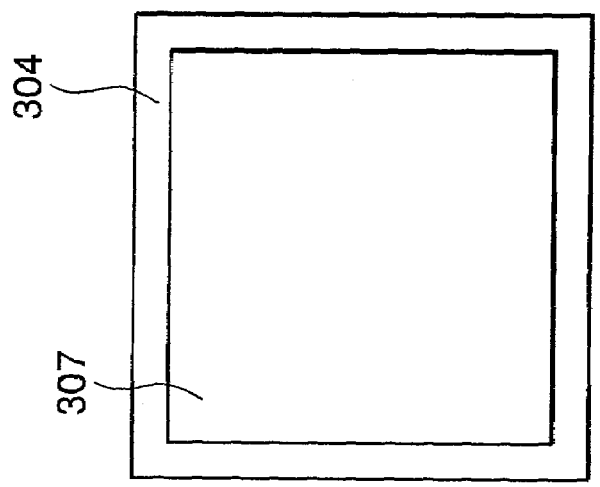
FIGS. 12A through 12C are plane views respectively illustrating shapes of contact vias connecting the copper pads 304 to the copper pads 308.
Figure 12B:
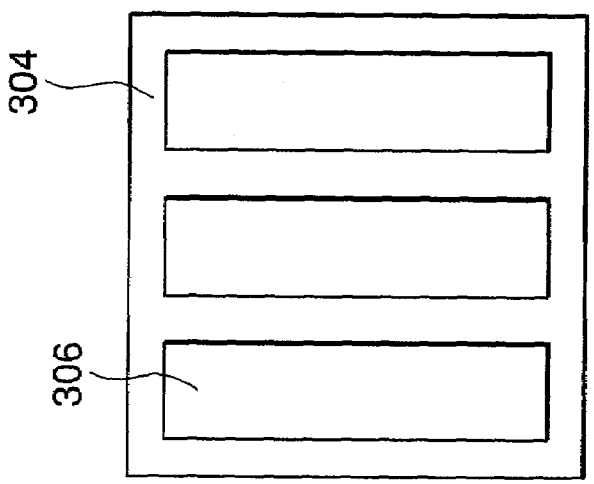
Figure 12A:
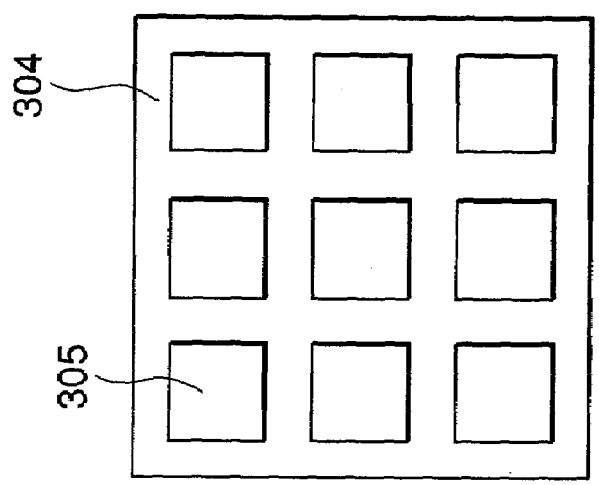
Figure 13:
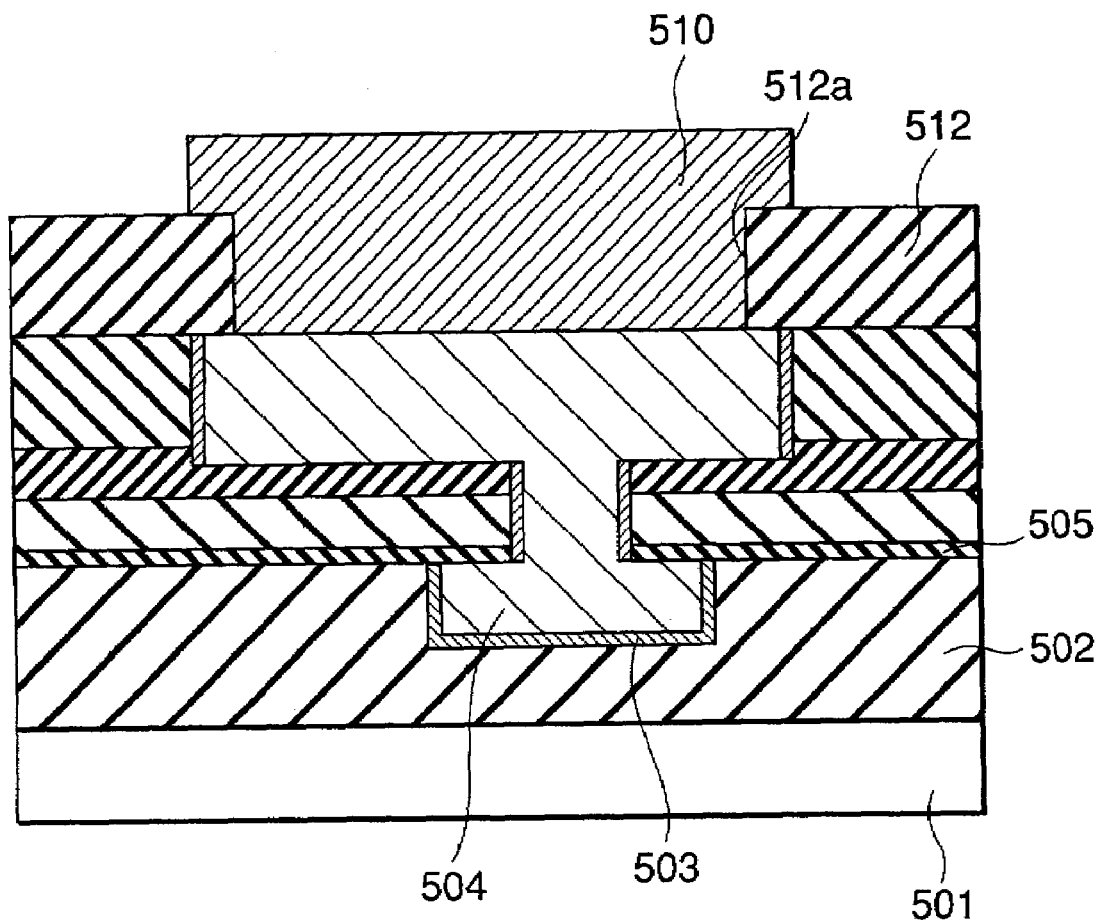
FIG. 13 is a cross-sectional view illustrating a conventional semiconductor device.
Figure 14A:
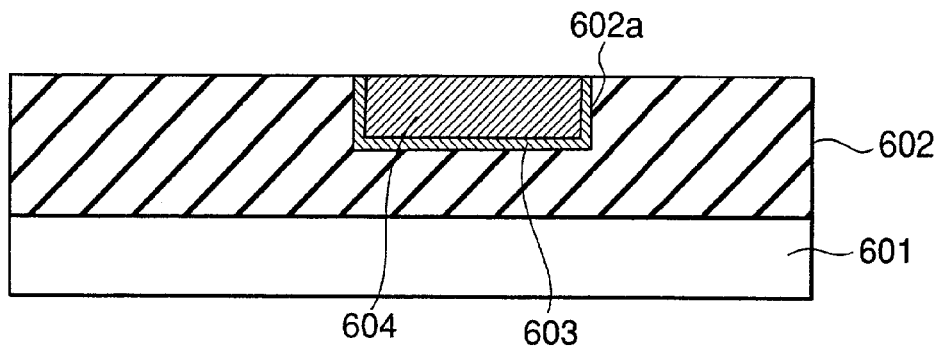
FIGS. 14A through 14C are cross-sectional views respectively illustrating a conventional manufacturing process of a semiconductor device.
Figure 14B:
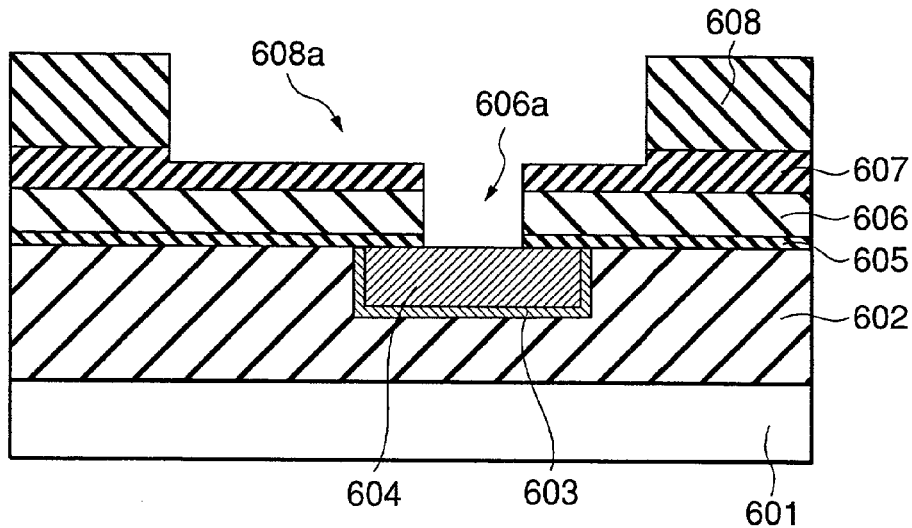
Figure 14C:
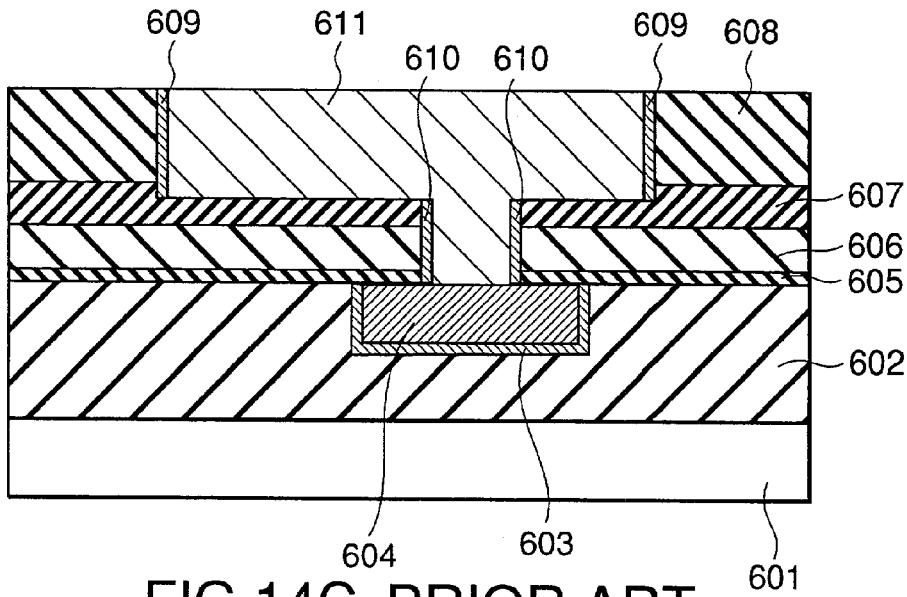
Figure 15A:
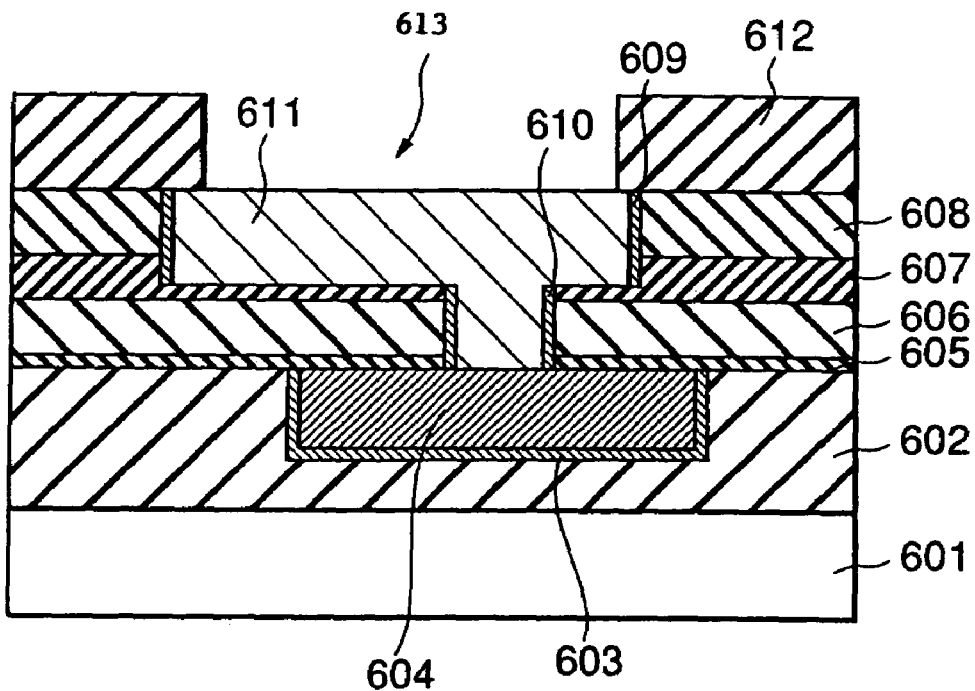
FIGS. 15A and 15B are cross-sectional views respectively illustrating a conventional manufacturing process of the semiconductor device.
Figure 15B:
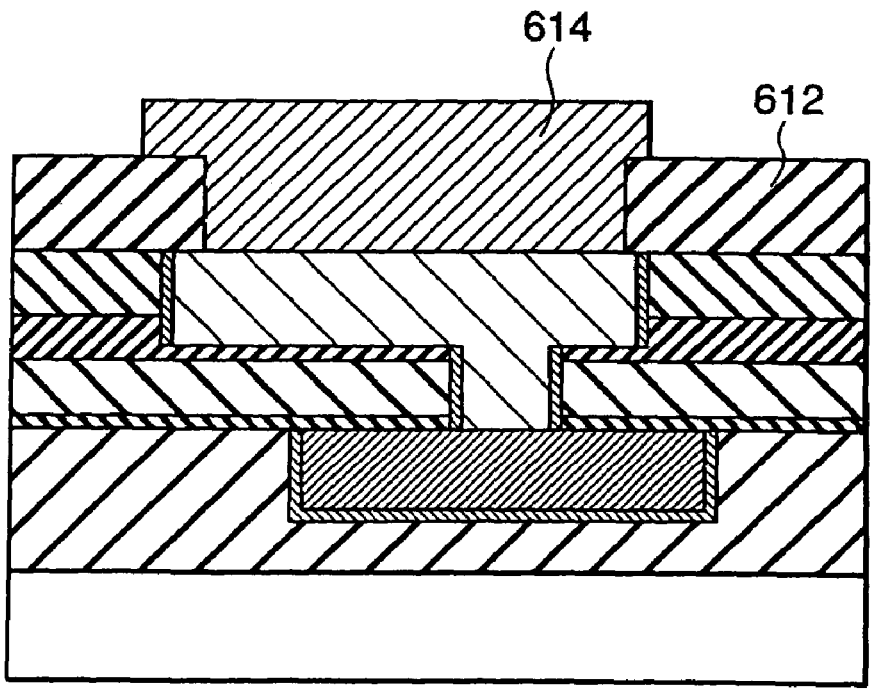

Moreover, the copper pads, as shown in FIGS. 11A and 11B, can be interconnected by a plurality of contact vias, whereas as shown in FIG. 12C, they can be interconnected by one inter-copper pad contact via 307. In addition, as shown in FIG. 12A, the copper pads can be interconnected by arranging a plurality of inter-copper pad contact vias 305 in a matrix, with the respective cross sections thereof being substantially square. Moreover, as shown in FIG. 12B, the copper pads can be interconnected by arranging a plurality of inter-copper pad contact vias 306, with the cross sections thereof being substantially rectangular.

The present invention provides a semiconductor device, which has a bond pad formed with an aluminum-based material on the copper interconnect and utilizes the process of forming the bonding pad more effectively.

In addition, the present invention provides a semiconductor device, which has a bonding pad formed with an aluminum-based material upon the copper interconnect and which allows even more wiring layers to be formed.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising a copper layer having a bonding portion, an insulating layer covering said copper layer, a first hole selectively formed in said insulating layer to expose said bonding portion of said copper layer, an aluminum layer, a first portion of which is patterned to form an aluminum bonding pad in electrical contact with said bonding portion of said copper layer through said first bole, and a second portion of which aluminum layer is patterned to form an aluminum interconnect on said insulating layer, said aluminum bonding pad and said aluminum interconnect being made of an aluminum-based material, an insulator protection film covering said insulating layer, said aluminum bonding pad and said aluminum interconnect to protect each of said aluminum bonding pad and said aluminum interconnect, a first barrier layer being formed between said aluminum bonding pad and said insulator protection film and a second barrier layer being formed between said aluminum interconnect and said insulator protection film, and a second hole selectively formed in said insulator protection film and said first barrier layer to expose apart of said aluminum bonding pad.

2. The device as claimed in claim 1, further comprising a third barrier layer intervening between said copper layer and said aluminum bonding pad.

3. The device as claimed in claim 1, wherein said copper layer includes a copper interconnect formed in electrical contact with said aluminum interconnect.

4. The device as claimed in claim 3, further comprising a fourth barrier layer intervening between said copper interconnect and said aluminum interconnect.

5. The device as claimed in claim 1, further comprising a substrate on which said copper layer is formed, said bonding portion of said copper layer being positioned between said aluminum bonding pad and said substrate.

6. The device as claimed in claim 1, wherein said copper bonding portion of said copper layer has an area which is substantially identical to that of said aluminum bonding pad.

7. The semiconductor device, as claimed in claim 1, wherein said aluminum-based material includes aluminum and at least one element selected from a group consisting of copper and silicon.

8. A semiconductor device comprising:
a substrate;
a copper pad formed over said substrate;
a copper interconnect formed over said substrate;
an insulating layer covering said copper pad and said copper interconnect and having a first hole exposing said copper pad therein;
an aluminum bonding pad formed on said copper pad in electrical contact therewith, said aluminum bonding pad being made of an aluminum-based material and formed in said first hole and elongated over said insulating layer, and
an aluminum interconnect formed on said copper interconnect in electrical contact therewith, said aluminum interconnect being made of an aluminum-based material.

9. The semiconductor device as claimed in claim 8, wherein;
said insulating layer has a second hole exposing said copper interconnect therein; and
said aluminum interconnect is formed in said second hole and elongated over said insulating layer.

10. A semiconductor device of a multi-level wiring structure having a first level and a second level that is a lower order than said first level, said device comprising:
a first copper layer formed at said second level;
a first aluminum layer formed at said first level and over said first copper layer in electrical contact with a part of said first copper layer, said first aluminum layer serving as a bonding pad and being made of an aluminum-based material; and
a second aluminum layer formed at said first level, said second aluminum layer serving as an interconnect and being made of an aluminum-based, wherein
said first level includes a first insulating layer covering said first copper layer and having a first hole exposing said first copper layer therein; and
said first aluminum layer is formed in said first hole and elongated over said insulating layer.

11. The device as claimed in claim 10, further comprising a second insulating layer covering each of said first and second aluminum layers, said second insulating layer having a hole selectively formed therein to expose apart of said first aluminum layer, said second aluminum layer being free from exposure by said second insulating layer.

12. The device as claimed in claim 11, further comprising a second copper layer formed at said second level, said second aluminum layer being formed over said second copper layer in electrical contact with a part of said copper layer.

* * * * *